United States Patent
Somekh et al.

(10) Patent No.: US 12,285,945 B2
(45) Date of Patent: Apr. 29, 2025

(54) METHOD AND APPARATUS FOR LOAD-LOCKED PRINTING

(71) Applicant: Kateeva, Inc., Newark, CA (US)

(72) Inventors: Sass Somekh, Los Altos, CA (US); Eliyahu Vronsky, Los Altos, CA (US); Conor F. Madigan, San Francisco, CA (US)

(73) Assignee: Kateeva, Inc., Newark, CA (US)

( * ) Notice: Subject to any disclaimer, the term of this patent is extended or adjusted under 35 U.S.C. 154(b) by 0 days.

(21) Appl. No.: 18/429,872

(22) Filed: Feb. 1, 2024

(65) Prior Publication Data
US 2024/0167143 A1 May 23, 2024

Related U.S. Application Data

(60) Continuation of application No. 17/804,419, filed on May 27, 2022, now Pat. No. 11,926,902, which is a
(Continued)

(51) Int. Cl.
*B41J 2/14* (2006.01)
*B05B 17/00* (2006.01)
(Continued)

(52) U.S. Cl.
CPC ............. *B41J 2/14* (2013.01); *B05B 17/0638* (2013.01); *B05B 17/0646* (2013.01);
(Continued)

(58) Field of Classification Search
CPC . B41J 2/015; B41J 2/14; B41J 11/0015; B41J 29/393; B05B 17/0638; B05C 13/02; B41M 5/0011; H01L 33/005; H05B 33/10
See application file for complete search history.

(56) References Cited

U.S. PATENT DOCUMENTS

| 3,216,858 A | 11/1965 | Bogdanowski |
| 3,251,139 A | 5/1966 | Strimling |

(Continued)

FOREIGN PATENT DOCUMENTS

| CN | 1416365 A | 5/2003 |
| CN | 1445089 A | 10/2003 |

(Continued)

OTHER PUBLICATIONS

Notice of Allowance issued Sep. 29, 2014 to U.S. Appl. No. 13/773,654.
(Continued)

*Primary Examiner* — James M Mellott
(74) *Attorney, Agent, or Firm* — Hauptman Ham, LLP

(57) ABSTRACT

The disclosure relates to a method and apparatus for preventing oxidation or contamination during a circuit printing operation. The circuit printing operation can be directed to OLED-type printing. In an exemplary embodiment, the printing process is conducted at a load-locked printer housing having one or more of chambers. Each chamber is partitioned from the other chambers by physical gates or fluidic curtains. A controller coordinates transportation of a substrate through the system and purges the system by timely opening appropriate gates. The controller may also control the printing operation by energizing the print-head at a time when the substrate is positioned substantially thereunder.

20 Claims, 9 Drawing Sheets

Translational Misalignment

Rotational Misalignment

Magnification Misalignment

Combinational Misalignment

Related U.S. Application Data continuation of application No. 17/450,713, filed on Oct. 13, 2021, now Pat. No. 11,802,331, which is a continuation of application No. 16/949,412, filed on Oct. 28, 2020, now Pat. No. 11,230,757, which is a continuation of application No. 15/409,844, filed on Jan. 19, 2017, now Pat. No. 10,851,450, which is a continuation of application No. 14/996,086, filed on Jan. 14, 2016, now Pat. No. 10,519,535, which is a continuation of application No. 13/776,602, filed on Feb. 25, 2013, now Pat. No. 9,248,643, which is a division of application No. 13/551,209, filed on Jul. 17, 2012, now Pat. No. 8,720,366, which is a continuation of application No. 12/652,040, filed on Jan. 5, 2010, now Pat. No. 8,383,202, which is a continuation-in-part of application No. 12/139,391, filed on Jun. 13, 2008, now abandoned.

(60) Provisional application No. 61/142,575, filed on Jan. 5, 2009.

(51) Int. Cl.
| | |
|---|---|
| *B05C 5/02* | (2006.01) |
| *B05C 13/02* | (2006.01) |
| *B05C 15/00* | (2006.01) |
| *B05D 5/00* | (2006.01) |
| *B41J 2/015* | (2006.01) |
| *B41J 2/165* | (2006.01) |
| *B41J 2/315* | (2006.01) |
| *B41J 11/00* | (2006.01) |
| *B41J 29/393* | (2006.01) |
| *B41M 5/00* | (2006.01) |
| *C23C 4/137* | (2016.01) |
| *H01L 21/67* | (2006.01) |
| *H01L 21/677* | (2006.01) |
| *H05B 33/10* | (2006.01) |
| *H10H 20/01* | (2025.01) |
| *H10K 71/00* | (2023.01) |
| *H10K 71/13* | (2023.01) |
| *H10K 71/40* | (2023.01) |

(52) U.S. Cl.
CPC ............ *B05C 5/0208* (2013.01); *B05C 13/02* (2013.01); *B41J 2/015* (2013.01); *B41J 2/16505* (2013.01); *B41J 2/315* (2013.01); *B41J 11/0015* (2013.01); *B41J 29/393* (2013.01); *B41M 5/0011* (2013.01); *B41M 5/0047* (2013.01); *C23C 4/137* (2016.01); *H01L 21/67201* (2013.01); *H01L 21/67784* (2013.01); *H05B 33/10* (2013.01); *H10H 20/01* (2025.01); *B05C 15/00* (2013.01); *B05D 5/00* (2013.01); *B41J 2202/09* (2013.01); *B41J 2202/16* (2013.01); *H10K 71/00* (2023.02); *H10K 71/135* (2023.02); *H10K 71/40* (2023.02)

(56) References Cited

U.S. PATENT DOCUMENTS

| | | | |
|---|---|---|---|
| 3,498,343 A | 3/1970 | Sperberg | |
| 3,632,374 A | 1/1972 | Greiller | |
| 3,670,466 A | 6/1972 | Lynch | |
| 3,885,362 A | 5/1975 | Pollock | |
| 4,226,897 A | 10/1980 | Coleman | |
| 4,409,889 A | 10/1983 | Burleson | |
| 4,581,478 A | 4/1986 | Pugh | |
| 4,587,002 A | 5/1986 | Bok | |
| 4,676,144 A | 6/1987 | Smith, III | |
| 4,693,175 A | 9/1987 | Hashimoto | |
| 4,721,121 A | 1/1988 | Adams | |
| 5,029,518 A | 7/1991 | Austin | |
| 5,065,169 A | 11/1991 | Vincent | |
| 5,314,377 A | 5/1994 | Pelosi, III | |
| 5,344,365 A | 9/1994 | Scott | |
| 5,388,944 A | 2/1995 | Takanabe | |
| 5,562,539 A | 10/1996 | Hashimoto | |
| 5,651,625 A | 7/1997 | Smith | |
| 5,788,447 A | 8/1998 | Yonemitsu | |
| 5,896,154 A | 4/1999 | Mitani | |
| 5,951,770 A | 9/1999 | Perlov | |
| 6,023,899 A | 2/2000 | Mecozzi | |
| 6,049,167 A | 4/2000 | Onitsuka | |
| 6,089,282 A | 7/2000 | Spiegelman | |
| 6,375,304 B1 | 4/2002 | Aldrich | |
| 6,437,351 B1 | 8/2002 | Smick | |
| 6,604,810 B1 | 8/2003 | Silverbrook | |
| 6,781,684 B1 | 8/2004 | Ekhoff | |
| 6,869,636 B2 | 3/2005 | Chung | |
| 7,258,768 B2 | 8/2007 | Yamazaki | |
| 7,326,300 B2 | 2/2008 | Sun | |
| 7,384,662 B2 | 6/2008 | Takano | |
| 7,387,662 B2 | 6/2008 | Ahman | |
| 8,383,202 B2 * | 2/2013 | Somekh | H05B 33/10 427/261 |
| 8,802,186 B2 * | 8/2014 | Somekh | C23C 4/137 427/261 |
| 8,802,195 B2 * | 8/2014 | Somekh | B05C 13/02 427/261 |
| 9,174,433 B2 * | 11/2015 | Somekh | B41J 2/015 |
| 9,248,643 B2 * | 2/2016 | Somekh | B41J 29/393 |
| 10,519,535 B2 | 12/2019 | Somekh | |
| 10,851,450 B2 * | 12/2020 | Somekh | H01L 21/67201 |
| 11,230,757 B2 * | 1/2022 | Somekh | B41J 2/015 |
| 11,802,331 B2 * | 10/2023 | Somekh | B05C 5/0208 |
| 11,926,902 B2 * | 3/2024 | Somekh | B05C 5/0208 |
| 2001/0038408 A1 | 11/2001 | Codos | |
| 2001/0041530 A1 | 11/2001 | Hara | |
| 2002/0033860 A1 | 3/2002 | Kubota | |
| 2002/0071745 A1 | 6/2002 | Mainberger | |
| 2002/0079057 A1 | 6/2002 | Yoshioka | |
| 2002/0084464 A1 | 7/2002 | Yamazaki | |
| 2002/0113846 A1 | 8/2002 | Wang | |
| 2002/0124906 A1 | 9/2002 | Suzuki | |
| 2002/0191063 A1 | 12/2002 | Gelbart | |
| 2003/0000476 A1 | 1/2003 | Matsunaga | |
| 2003/0040061 A1 | 2/2003 | Baker | |
| 2003/0040193 A1 | 2/2003 | Bailey | |
| 2003/0097929 A1 | 5/2003 | Watanabe | |
| 2003/0175414 A1 | 9/2003 | Hayashi | |
| 2004/0050325 A1 | 3/2004 | Samoilov | |
| 2004/0062856 A1 | 4/2004 | Marcus | |
| 2004/0075385 A1 | 4/2004 | Tao | |
| 2004/0086631 A1 | 5/2004 | Han | |
| 2004/0105738 A1 | 6/2004 | Ahn | |
| 2004/0115339 A1 | 6/2004 | Ito | |
| 2004/0118309 A1 | 6/2004 | Fedor | |
| 2004/0123804 A1 | 7/2004 | Yamazaki | |
| 2004/0254297 A1 | 12/2004 | Hsu | |
| 2005/0005850 A1 | 1/2005 | Yamazaki | |
| 2005/0040338 A1 | 2/2005 | Weiss | |
| 2005/0062773 A1 | 3/2005 | Fouet | |
| 2005/0104945 A1 | 5/2005 | Chung | |
| 2005/0140764 A1 | 6/2005 | Chang | |
| 2005/0156956 A1 | 7/2005 | Silverbrook | |
| 2005/0223994 A1 | 10/2005 | Blomiley | |
| 2006/0008591 A1 * | 1/2006 | Sun | H01L 21/67784 118/326 |
| 2006/0045669 A1 | 3/2006 | Namioka | |
| 2006/0054774 A1 | 3/2006 | Yassour | |
| 2006/0096395 A1 | 5/2006 | Weiss | |
| 2006/0099328 A1 | 5/2006 | Waite | |
| 2006/0119669 A1 | 6/2006 | Sharma | |
| 2006/0137544 A1 | 6/2006 | Liu | |
| 2006/0186804 A1 | 8/2006 | Sakakura | |
| 2006/0219605 A1 | 10/2006 | Devitt | |
| 2006/0222481 A1 | 10/2006 | Foree | |

(56) References Cited

U.S. PATENT DOCUMENTS

| | | |
|---|---|---|
| 2006/0236938 A1 | 10/2006 | Powell |
| 2006/0273713 A1 | 12/2006 | Mehta |
| 2007/0004328 A1 | 1/2007 | Balzer |
| 2007/0021050 A1 | 1/2007 | Kennedy |
| 2007/0026151 A1 | 2/2007 | Higginson |
| 2007/0044713 A1 | 3/2007 | Yasui |
| 2007/0046185 A1 | 3/2007 | Kim |
| 2007/0099310 A1 | 5/2007 | Vepa |
| 2007/0172292 A1 | 7/2007 | Silverbrook |
| 2007/0234952 A1 | 10/2007 | Kojima |
| 2007/0257033 A1 | 11/2007 | Yamada |
| 2008/0079958 A1 | 4/2008 | Niimi |
| 2008/0085652 A1 | 4/2008 | Winters |
| 2008/0145190 A1 | 6/2008 | Yassour |
| 2008/0206036 A1 | 8/2008 | Smith |
| 2008/0241587 A1 | 10/2008 | Ohmi |
| 2008/0259101 A1 | 10/2008 | Kurita |
| 2008/0260938 A1 | 10/2008 | Ikeda |
| 2008/0273072 A1 | 11/2008 | Chung |
| 2008/0308037 A1 | 12/2008 | Bulovic |
| 2008/0311307 A1 | 12/2008 | Bulovic |
| 2009/0056116 A1 | 3/2009 | Presley |
| 2012/0056923 A1 | 3/2012 | Vronsky |
| 2022/0024226 A1 | 1/2022 | Somekh |

FOREIGN PATENT DOCUMENTS

| | | |
|---|---|---|
| CN | 1722918 A | 1/2006 |
| CN | 1956209 A | 5/2007 |
| CN | 101189271 A | 5/2008 |
| JP | 549294 | 6/1993 |
| JP | H09503704 A | 4/1997 |
| JP | H10249237 A | 9/1998 |
| JP | H11312640 A | 11/1999 |
| JP | 2000223548 A | 8/2000 |
| JP | 2002069650 A | 3/2002 |
| JP | 2002093878 A | 3/2002 |
| JP | 2002359180 A | 12/2002 |
| JP | 2003048312 A | 2/2003 |
| JP | 2003173871 A | 6/2003 |
| JP | 2003266007 A | 9/2003 |
| JP | 2003272847 A | 9/2003 |
| JP | 2004146369 A | 5/2004 |
| JP | 2004164873 A | 6/2004 |
| JP | 2004241751 A | 8/2004 |
| JP | 2004247111 A | 9/2004 |
| JP | 2004253332 A | 9/2004 |
| JP | 2004291456 A | 10/2004 |
| JP | 2004362854 A | 12/2004 |
| JP | 2004535956 A | 12/2004 |
| JP | 2005502487 A | 1/2005 |
| JP | 2005074299 A | 3/2005 |
| JP | 2005218899 A | 8/2005 |
| JP | 2005254038 A | 9/2005 |
| JP | 2006026463 A | 2/2006 |
| JP | 2006123551 A | 5/2006 |
| JP | 2006150900 A | 6/2006 |
| JP | 2006159116 A | 6/2006 |
| JP | 2007013140 A | 1/2007 |
| JP | 2007122914 A | 5/2007 |
| JP | 2007511890 A | 5/2007 |
| JP | 2007147648 A | 6/2007 |
| JP | 2007273093 A | 10/2007 |
| JP | 2007299785 A | 11/2007 |
| JP | 2008004919 A | 1/2008 |
| JP | 2008047340 A | 2/2008 |
| JP | 2008511146 A | 4/2008 |
| JP | 2009501083 A | 1/2009 |
| JP | 2009136799 A | 6/2009 |
| JP | 4423082 B2 | 3/2010 |
| JP | 2010134315 A | 6/2010 |
| JP | 2010533349 A | 10/2010 |
| JP | 4954162 B2 | 6/2012 |
| KR | 20020006670 A | 1/2002 |
| KR | 20040072383 A | 8/2004 |
| KR | 20060044265 A | 5/2006 |
| KR | 20060084048 A | 7/2006 |
| KR | 20060088909 A | 8/2006 |
| KR | 20070042272 A | 4/2007 |
| KR | 20070069287 A | 7/2007 |
| KR | 20070079834 A | 8/2007 |
| KR | 20090126568 A | 12/2009 |
| KR | 20100079840 A | 7/2010 |
| TW | 200302678 A | 8/2003 |
| TW | 200303829 A | 9/2003 |
| TW | 200504828 A | 2/2005 |
| TW | I247554 B | 1/2006 |
| TW | 200618308 A | 6/2006 |
| TW | 200714652 A | 4/2007 |
| TW | 201211701 A | 3/2012 |
| WO | 2001060623 A1 | 8/2001 |
| WO | 2004088740 A1 | 10/2004 |
| WO | 2006041240 A1 | 4/2006 |

OTHER PUBLICATIONS

Notice of Allowance issued Sep. 29, 2020 for U.S. Appl. No. 16/362,595.
Notice of Allowance issued Sep. 9, 2015 to U.S. Appl. No. 13/774,693.
Notice of Final Rejection dated Oct. 18, 2022 for KR Patent Application No. 10-2021-7041315.
Notice of Final Rejection dated Sep. 27, 2022 for KR Patent Application No. 10-2021-7041139.
Notice of Final Rejection issued Jul. 29, 2021 to KR Patent Application No. 10-2020-7032729.
Notice of First Refusal issued Jul. 19, 2019 for KR Patent Application No. 10-2017-7031818.
Notice of Reason for Refusal issued Oct. 1, 2021 for JP Patent Application No. 2020-181803.
Notice of Reasons for Refusal issued Aug. 1, 2021 in KR Patent Application No. 10-2021-7018547.
Notification of First Refusal issued Oct. 23, 2018 to KR Patent application No. 10-2017-7018730.
Notification of First Refusal issued Oct. 23, 2018 to KR Patent Application No. 10-2017-7018732.
Notification of Provisional Rejection issued Aug. 22, 2016 to KR Patent Application No. 10-2015-7003107.
Notification of Provisional Rejection issued May 25, 2017 for KR Patent Application No. 10-2014-7020478.
Notification of Reason for Refusal issued Dec. 14, 2020 in KR Patent Application No. 10-2020-7027327.
Notification of Reason for Refusal issued Feb. 22, 2022 for KR Patent Application No. 10-2021-7018547.
Notification of Reason for Refusal issued Mar. 28, 2022 in KR Patent Application No. 10-2021-7041315.
Office Action issued Apr. 23, 2019 for JP Patent Application No. 2018-140175.
Office Action issued Aug. 3, 2017 for JP Patent Application No. 2016-148189.
Office Action issued Dec. 18, 2019 for CN Patent Application No. 201811010130.8.
Office Action issued Dec. 18, 2019 for TW Patent Application No. 108102087.
Office Action issued Dec. 24, 2019 for JP Patent Application No. 2018-140175.
Office Action issued Feb. 2, 2018 to JP Patent Application No. 2016-519508.
Office Action issued Jan. 28, 2016 to JP Patent Application No. 2015-526775.
Office Action issued Jul. 16, 2019 to JP Patent Application No. 2018-115532.
Office Action issued Jun. 22, 2016 to CN Patent Application No. 201480045349.5.
Office Action issued Jun. 23, 2016 to CN Patent Application No. 201380052559.2.
Office Action issued Jun. 26, 2018 for CN Patent Application No. 201710427402.3.
Office Action issued Jun. 28, 2019 to JP Patent Application No. 2018-156034.

(56) References Cited

OTHER PUBLICATIONS

Office Action issued Jun. 28, 2020 to CN Patent Application No. 201710914561.6.
Office Action issued Mar. 23, 2015 to CN Patent Application No. 201210596572.
Office Action issued May 7, 2019 for JP Patent Application No. 2018-142544.
Office Action issued Sep. 3, 2018 to CN Patent Application No. 201710428301.8.
Official Action issued Jul. 28, 2016 for JP Patent Application No. 2014-548852.
Official Action issued Jul. 30, 2019 to JP Patent Application No. 2018-107016.
Penultimate Office Action issued Aug. 29, 2019 to JP Patent Application No. 2017-114390.
Penultimate Office Action issued Mar. 22, 2018 to JP Patent Application No. 2016-90252.
Provisional Rejection issued Apr. 4, 2019 to KR Patent Application No. 10-2019-7008155.
Provisional Rejection issued Feb. 25, 2019 for KR Patent Application No. 20187027231.
Provisional Rejection issued Jan. 18, 2018 to KR Patent Application No. 10-2017-7018732.
Provisional Rejection issued Jan. 7, 2020 to KR Patent Application No. 10-2019-7037354.
Provisional Rejection issued Jul. 6, 2018 to KR Patent Application No. 10-2016-7000033.
Provisional Rejection issued Oct. 17, 2017 to KR Patent Application No. 10-2015-7027963.
Rejection Decision issued Jul. 25, 2018 to TW Patent Application No. 103117122.
Second CN Office Action issued Sep. 27, 2017 for CN Patent Application No. 201610181336.1.
Second Office Action issued Jul. 2, 2019 to CN Patent Application No. 201710914561.6.
Second Office Action issued Jul. 31, 2017 for CN Patent Application No. 20140027671.5.
Second Office Action issued Jun. 26, 2018 for CN Patent Application No. 201710427402.3.
Second Office Action issued Mar. 2, 2017 to CN Patent Application No. 201380052559.2.
Second Office Action issued Mar. 5, 2019 to CN Patent Application No. 201580023550.8.
Second Office Action issued Oct. 8, 2015 to CN Patent Application No. 201210596572.
Street et al., "Jet Printing of Active-Matrix TFT Backplanes for Displays and Sensors", IS&T Archiving, Dec. 2005, vol. 20, No. 5, 16 pages.
TW Examination Report and Search Report issued Mar. 13, 2017 for TW Patent Application No. 105144240.
Non-Final Office Action issued Feb. 28, 2014 to U.S. Appl. No. 13/773,649.
Non-Final Office Action issued Feb. 7, 2014 to U.S. Appl. No. 13/773,643.
Non-Final Office Action issued Jan. 17, 2017 for U.S. Appl. No. 14/996,086.
Non-Final Office action issued Jan. 26, 2018 to U.S. Appl. No. 15/184,755.
Non-Final Office Action issued Jul. 1, 2014 to U.S. Appl. No. 13/773,654.
Non-Final Office Action issued Jun. 14, 2012 for U.S. Appl. No. 12/652,040.
Non-Final Office Action issued Jun. 29, 2018 to U.S. Appl. No. 15/605,806.
Non-Final Office Action issued Mar. 10, 2016 to U.S. Appl. No. 14/275,637.
Non-Final Office Action issued Mar. 28, 2019 to U.S. Appl. No. 16/102,392.
Non-Final Office Action issued May 16, 2014 to U.S. Appl. No. 13/802,304.
Non-Final Office Action issued May 23, 2019 for U.S. Appl. No. 15/409,844.
Non-Final Office Action issued Nov. 20, 2015 for U.S. Appl. No. 14/637,301.
Non-Final Office Action issued Nov. 4, 2016 for U.S. Appl. No. 14/543,786.
Non-Final Office Action issued Oct. 17, 2018 to U.S. Appl. No. 15/446,984.
Non-Final Office Action issued Oct. 3, 2019 to U.S. Appl. No. 16/362,595.
Non-Final Office Action issued Oct. 5, 2017 to U.S. Appl. No. 15/594,856.
Non-final Office Action issued Oct. 5, 2022 for U.S. Appl. No. 17/247,591.
Non-final Office Action issued Oct. 6, 2021 for U.S. Appl. No. 17/247,591.
Non-Final Office Action issued on Mar. 24, 2021 for U.S. Appl. No. 16/553,909.
Non-Final Office Action issued Sep. 18, 2017 to U.S. Appl. No. 14/543,786.
Non-Final Office Action mailed Sep. 29, 2023 for U.S. Appl. No. 17/443,450.
Notice of Allowance dated Apr. 12, 2024 for U.S. Appl. No. 18/185,631.
Notice of Allowance dated Apr. 26, 2021 for U.S. Appl. No. 16/421,834.
Notice of Allowance dated Mar. 4, 2024 for U.S. Appl. No. 17/247,591.
Notice of Allowance dated Mar. 8, 2024 for U.S. Appl. No. 17/443,450.
Notice of Allowance issued Aug. 5, 2019 to U.S. Appl. No. 15/446,984.
Notice of Allowance issued Dec. 7, 2012 to U.S. Appl. No. 12/652,040.
Notice of Allowance issued Dec. 9, 2014 for U.S. Appl. No. 13/802,304.
Notice of Allowance issued Feb. 20, 2014 to U.S. Appl. No. 13/551,209.
Notice of Allowance issued Jan. 31, 2017 for U.S. Appl. No. 14/205,340.
Notice of Allowance issued Jan. 6, 2020 to U.S. Appl. No. 14/543,786.
Notice of Allowance issued Jul. 1, 2014 to U.S. Appl. No. 13/773,649.
Notice of Allowance issued Jul. 10, 2019 for U.S. Appl. No. 15/106,907.
Notice of Allowance issued Jul. 14, 2017 to U.S. Appl. No. 15/385,803.
Notice of Allowance issued Jul. 17, 2015 for U.S. Appl. No. 13/570,154.
Notice of Allowance issued Jul. 2, 2014 to U.S. Appl. No. 13/774,577.
Notice of Allowance issued Jun. 24, 2019 for U.S. Appl. No. 15/184,755.
Notice of Allowance issued Jun. 30, 2014 to U.S. Appl. No. 13/773,643.
Notice of Allowance issued Jun. 9, 2022 for U.S. Appl. No. 16/574,334.
Notice of Allowance issued Mar. 29, 2017 to U.S. Appl. No. 15/423,169.
Notice of Allowance issued Mar. 7, 2019 to U.S. Appl. No. 15/605,806.
Notice of Allowance issued Mar. 8, 2019 to U.S. Appl. No. 14/275,637.
Notice of Allowance issued Mar. 9, 2018 to U.S. Appl. No. 15/594,856.
Notice of Allowance issued May 16, 2016 to U.S. Appl. No. 14/637,301.
Notice of Allowance issued Nov. 19, 2015 to U.S. Appl. No. 13/776,602.
Notice of Allowance issued Oct. 23, 2019 to U.S. Appl. No. 16/102,392.
Notice of Allowance issued Oct. 4, 2019 to U.S. Appl. No. 15/417,583.
Notice of Allowance issued Oct. 6, 2014 for U.S. Appl. No. 13/720,830.

(56) References Cited

OTHER PUBLICATIONS

Notice of Allowance issued Sep. 16, 2019 to U.S. Appl. No. 14/996,086.
CN First Office Action dated Dec. 2, 2022 for CN Patent Application No. 201910510788.3.
CN Office Action dated Sep. 26, 2022 for CN Patent Application No. 202010333896.0.
CN Office Action issued Jan. 23, 2017 for CN Patent Application No. 201480027671.5.
Corrected Notice of Allowability issued Oct. 23, 2018 to U.S. Appl. No. 14/996,086.
Corrected Notice of Allowability issued Oct. 31, 2014 for U.S. Appl. No. 13/720,830.
Corrected Notice of Allowability issued Sep. 20, 2017 to U.S. Appl. No. 15/385,803.
EP Extended Search Report dated Aug. 24, 2021 for EP Patent Application No. 21167787.7.
EP Search Report issued Mar. 25, 2019 to EP Patent Application No. 18201256.7.
European Search Report issued Apr. 17, 2019 for EP Patent Application No. 19162637.3.
Examination Report issued Apr. 19, 2017 for TW Patent Application No. 103108995.
Examination Report issued Apr. 26, 2016 to TW Patent Application No. 101148932.
Examination Report issued Aug. 13, 2015 for CN Patent Application No. 201310704315.X.
Examination Report issued Mar. 22, 2018 to TW Patent Application No. 103117122.
Examination Report issued Mar. 27, 2019 for TW Patent Application No. 107102956.
Examination Report issued May 2, 2019 for TW Patent Application No. 107116642.
Examination Report issued May 20, 2019 for EP Patent Application No. 14810543.0.
Examination Report issued Sep. 15, 2021 for TW Patent Application No. 109109239.
Extended European Search Report issued Apr. 12, 2017 for EP Patent Application No. 14810543.0.
Extended European Search Report issued Jul. 1, 2016 for EP Patent Application No. 13585304.2.
Extended European Search Report issued Jun. 19, 2017 for EP Patent Application No. 14779907.6.
Final Office Action dated Apr. 14, 2022 for U.S. Appl. No. 17/247,591.
Final Office Action dated Dec. 19, 2022 for JP Patent Application No. 2021-143917.
Final Office Action dated Nov. 18, 2022 for JP Patent Application No. 2020-144660.
Final Office Action dated Oct. 27, 2023 for U.S. Appl. No. 17/820,782.
Final Office Action issued Aug. 5, 2019 to U.S. Appl. No. 16/102,392.
Final Office Action issued Jul. 19, 2017 for U.S. Appl. No. 15/409,844.
Final Office Action issued Jul. 28, 2017 for U.S. Appl. No. 14/996,086.
First Office Action issued Sep. 26, 2023 in CN Patent Application No. 202010333896.0.
KR Decision of Refusal dated Mar. 31, 2023 for KR Patent Application No. 10-2022-7040440.
Non-final Office Action dated Jul. 3, 2023 for U.S. Appl. No. 17/820,782.
Official Action issued May 14, 2024 in TW Patent Application No. 112143522.
KR Office Action dated Aug. 9, 2024 for KR Patent Application No. 10-2024-7003182.
Final Office Action issued Jul. 9, 2019 to U.S. Appl. No. 14/996,086.
Final Office Action issued Jun. 10, 2014 to U.S. Appl. No. 13/773,649.
Final Office Action issued Jun. 12, 2014 to U.S. Appl. No. 13/773,643.
Final Office Action issued Jun. 12, 2020 to U.S. Appl. No. 16/362,595.
Final Office Action issued Jun. 18, 2014 to U.S. Appl. No. 13/774,577.
Final Office Action issued Mar. 22, 2019 to U.S. Appl. No. 15/446,984.
Final Office Action issued Mar. 7, 2018 to U.S. Appl. No. 14/543,786.
Final Office Action issued May 14, 2018 to JP Patent Application No. 2016-148189.
Final Office Action issued Nov. 21, 2018 to JP Patent Application No. 2016-090252.
Final Office Action issued Nov. 8, 2013 to U.S. Appl. No. 13/551,209.
Final Office Action issued Oct. 14, 2016 for U.S. Appl. No. 14/205,340.
Final Office Action issued Oct. 25, 2019 to U.S. Appl. No. 15/409,844.
Final Office Action issued Oct. 7, 2016 for U.S. Appl. No. 14/275,637.
Forrest, Stephen R., "The Path to Ubiquitous and Low-cost Organic Electronic Appliances on Plastic," Nature, Apr. 29, 2004, vol. 428, pp. 911-918.
Fourth Office Action issued Mar. 25, 2016 for CN Patent Application No. 201210596572.1.
International Search Report and Written Opinion issued Dec. 22, 2014 for PCT Application No. PCT/US14/023820.
International Search Report and Written Opinion issued Mar. 11, 2014 for PCT Application No. PCT/US13/063128.
International Search Report and Written Opinion issued Oct. 8, 2014 for PCT Application No. PCT/US2014/037722.
International Search Report and Written Opinion issued on Feb. 26, 2013 for PCT Application No. PCT/US12/70717.
International Search Report and Written Opinion issued on Jun. 18, 2013 for PCT Application No. PCT/US13/031083.
JP Non-final Office Action dated Apr. 5, 2022 for Application No. 2020-144660.
JP Notice of Reason for Refusal dated Jun. 28, 2021 for Application No. 2020-144660.
JP Office Action dated Apr. 15, 2024 for JP Patent Application No. 2023-037153.
JP Office Action issued Apr. 26, 2017 for JP Patent Application No. 2016-90252.
JP Office Action issued Jun. 1, 2017 to JP Patent Application No. 2016-501353.
KR Decision of Rejection dated Feb. 17, 2023 for KR Patent Application No. 10-2021-7041315.
KR Office Action dated Jan. 17, 2024 for KR Patent Application No. 10-2023-7015024.
KR Office Action dated Jul. 1, 2022 for Application No. 10-2022-7013035.
KR Office Action dated Nov. 17, 2022 for KR Patent Application No. 10-2022-7029657.
KR Office Action issued Dec. 10, 2021 for KR Patent Application No. 10-2021-7036621.
KR Office Action issued Dec. 16, 2021 for KR Patent Application No.
KR Second Office Action dated Jan. 11, 2024 for KR Patent Application No. 10-2023-7015116.
Non-final Office Action dated Feb. 28, 2023 for U.S. Appl. No. 17/302,841.
Non-final Office Action dated Mar. 10, 2023 for U.S. Appl. No. 17/450,713.
Non-final Office Action dated Mar. 28, 2022 for U.S. Appl. No. 16/574,334.
Non-final Office Action dated Sep. 27, 2023 for U.S. Appl. No. 18/185,631.
Non-Final Office Action issued Apr. 15, 2015 to U.S. Appl. No. 13/776,602.
Non-Final Office Action issued Apr. 17, 2015 to U.S. Appl. No. 13/774,693.
Non-Final Office Action issued Apr. 24, 2013 to U.S. Appl. No. 13/551,209.
Non-Final Office Action issued Apr. 27, 2016 to U.S. Appl. No. 14/543,786.
Non-Final Office Action issued Apr. 28, 2014 to U.S. Appl. No. 13/720,830.
Non-Final Office Action issued Apr. 4, 2016 to U.S. Appl. No. 14/205,340.
Non-final Office Action issued Aug. 8, 2022 for JP Patent Application No. 2021-143917.
Non-Final Office Action issued Aug. 9, 2019 for U.S. Appl. No. 14/543,786.

(56) References Cited

OTHER PUBLICATIONS

Non-Final Office Action issued Dec. 11, 2020 to U.S. Appl. No. 16/421,834.
Non-Final Office Action issued Feb. 13, 2018 for U.S. Appl. No. 14/996,086.
Non-Final Office Action issued Feb. 17, 2017 for U.S. Appl. No. 15/409,844.

* cited by examiner

METHOD AND APPARATUS FOR LOAD-LOCKED PRINTING

CROSS REFERENCE TO RELATED APPLICATIONS

This application is a continuation of U.S. patent application Ser. No. 17/804,419, filed May 27, 2022, which is a continuation of U.S. patent application Ser. No. 17/450,713, filed Oct. 13, 2021, which is a continuation of U.S. patent application Ser. No. 16/949,412, filed Oct. 28, 2020, now U.S. Pat. No. 11,230,757, issued Jan. 25, 2022, which is a continuation of U.S. patent application Ser. No. 15/409,844, filed Jan. 19, 2017, now U.S. Pat. No. 10,851,450, issued Dec. 1, 2020, which is a continuation of U.S. patent application Ser. No. 14/996,086, filed Jan. 14, 2016, now U.S. Pat. No. 10,519,535, issued Dec. 31, 2019, which is a continuation of U.S. patent application Ser. No. 13/776,602, filed Feb. 25, 2013, now U.S. Pat. No. 9,248,643, issued Feb. 2, 2016, which is a division of U.S. patent application Ser. No. 13/551,209, now U.S. Pat. No. 8,720,366, issued May 13, 2014, which is a continuation of U.S. application Ser. No. 12/652,040, filed Jan. 5, 2010, now U.S. Pat. No. 8,383,202, issued Feb. 26, 2013, which claims the benefit of U.S. Provisional Application No. 61/142,575, filed Jan. 5, 2009, and which is also a continuation-in-part of U.S. application Ser. No. 12/139,391 filed Jun. 13, 2008, now abandoned, the disclosure of each, which is incorporated herein by reference in its entirety.

FIELD OF THE INVENTION

The disclosure relates to a method and apparatus for efficient deposition of a patterned film on a substrate. More specifically, the disclosure relates to a method and apparatus for supporting and transporting a substrate on gas bearing during thermal jet printing of material on a substrate.

DESCRIPTION OF RELATED ART

The manufacture of organic light emitting devices (OLEDs) requires depositing one or more organic films on a substrate and coupling the top and bottom of the film stack to electrodes. The film thickness is a prime consideration. The total layer stack thickness is about 100 nm and each layer is optimally deposited uniformly with an accuracy of better than .+−.1 nm. Film purity is also important. Conventional apparatuses form the film stack using one of two methods: (1) thermal evaporation of organic material in a relative vacuum environment and subsequent condensation of the organic vapor on the substrate; or, (2) dissolution of organic material into a solvent, coating the substrate with the resulting solution, and subsequent removal of the solvent.

Another consideration in depositing the organic thin films of an OLED is placing the films precisely at the desired location on the substrate. There are two conventional technologies for performing this task, depending on the method of film deposition. For thermal evaporation, shadow masking is used to form OLED films of a desired configuration. Shadow masking techniques require placing a well-defined mask over a region of the substrate followed by depositing the film over the entire substrate area. Once deposition is complete, the shadow mask is removed. The regions exposed through the mask define the pattern of material deposited on the substrate. This process is inefficient as the entire substrate must be coated, even though only the regions exposed through the shadow mask require a film. Furthermore, the shadow mask becomes increasingly coated with each use, and must eventually be discarded or cleaned. Finally, the use of shadow masks over large areas is made difficult by the need to use very thin masks (to achieve small feature sizes) that make said masks structurally unstable. However, the vapor deposition technique yields OLED films with high uniformity and purity and excellent thickness control.

For solvent deposition, ink jet printing can be used to deposit patterns of OLED films. Ink jet printing requires dissolving organic material into a solvent that yields a printable ink. Furthermore, ink jet printing is conventionally limited to the use of single layer OLED film stacks, which typically have lower performance as compared to multilayer stacks. The single-layer limitation arises because printing typically causes destructive dissolution of any underlying organic layers. Finally, unless the substrate is first prepared to define the regions into which the ink is to be deposited, a step that increases the cost and complexity of the process, ink jet printing is limited to circular deposited areas with poor thickness uniformity as compared to vapor deposited films. The material quality is also lower due to structural changes in the material that occur during the drying process and due to material impurities present in the ink. However, the ink jet printing technique is capable of providing patterns of OLED films over very large areas with good material efficiency.

No conventional technique combines the large area patterning capabilities of ink jet printing with the high uniformity, purity, and thickness control achieved with vapor deposition for organic thin films. Because ink jet processed single layer OLED devices continue to have inadequate quality for widespread commercialization, and thermal evaporation remains impractical for scaling to large areas, it is a major technological challenge for the OLED industry to develop a technique that can offer both high film quality and cost-effective large area scalability.

Manufacturing OLED displays may also require the patterned deposition of thin films of metals, inorganic semiconductors, and/or inorganic insulators. Conventionally, vapor deposition and/or sputtering have been used to deposit these layers. Patterning is accomplished using prior substrate preparation (e.g., patterned coating with an insulator), shadow masking as described above, and when a fresh substrate or protective layers are employed, conventional photolithography. Each of these approaches is inefficient as compared to the direct deposition of the desired pattern, either because it wastes material or requires additional processing steps. Thus, for these materials as well there is a need for a method and apparatus for depositing high-quality, cost effective, large area scalable films.

Certain applications of thermal jet printing require non-oxidizing environment to prevent oxidation of the deposited materials or associated inks. In a conventional method, a sealed nitrogen tent is used to prevent oxidation. Conventional systems use a floating system to support and move the substrate. A floatation system can be defined as a bearing system of alternative gas bearings and vacuum ports. The gas bearings provide the lubricity and non-contacting support for the substrate, while the vacuum supports the counter-force necessary to strictly control the height at which the relatively light-weight substrate floats. Since high-purity nitrogen gas can be a costly component of the printing system, it is important to minimize nitrogen loss to the ambient.

Accordingly, there is a need for load-locked printing system which supports a substrate on gas bearings while minimizing system leakage and nitrogen loss.

SUMMARY

The disclosure relates to a method and apparatus for preventing oxidation or contamination during a thermal jet printing operation. The thermal jet printing operation may include OLED printing and the printing material may include suitable ink composition. In an exemplary embodiment, the printing process is conducted at a load-locked printer housing having one or more chambers. Each chamber is partitioned from the other chambers by physical gates or fluidic curtains. A controller coordinates transportation of a substrate through the system and purges the system by timely opening appropriate gates. The substrate may be transported using gas bearings which are formed using a plurality of vacuum and gas input portals. The controller may also provide a non-oxidizing environment within the chamber using a gas similar to, or different from, the gas used for the gas bearings. The controller may also control the printing operation by energizing the print-head at a time when the substrate is positioned substantially thereunder.

In one embodiment, the disclosure relates to a method for printing a film of OLED material on a substrate by (i) receiving the substrate at an inlet chamber; (ii) flooding the inlet load-locked chamber with a noble gas and sealing the inlet chamber; (iii) directing at least a portion of the substrate to a print-head chamber and discharging a quantity of OLED material from a thermal jet discharge nozzle onto the portion of the substrate; (iv) directing the substrate to an outlet chamber; (v) partitioning the print-head chamber from the outlet chamber; and (vi) unloading the print-head from the outlet chamber. In one embodiment of the invention, the print-head chamber pulsatingly delivers a quantity of material from a thermal jet discharge nozzle to the substrate.

In another embodiment, the disclosure relates to a method for depositing a material on a substrate. The method includes the steps of: (i) receiving the substrate at an inlet chamber; (ii) flooding the inlet chamber with a chamber gas and sealing the inlet chamber; (iii) directing at least a portion of the substrate to a print-head chamber and discharging a quantity of material from a thermal jet discharge nozzle onto the portion of the substrate; (iv) directing the substrate to an outlet chamber; (v) partitioning the print-head chamber from the outlet chamber; and (vi) unloading the print-head from the outlet chamber. The print-head chamber pulsatingly delivers a quantity of material from a thermal jet discharge nozzle to the substrate.

In another embodiment, the disclosure relates to a load-locked printing apparatus, comprising an inlet chamber for receiving a substrate, the inlet chamber having a first partition and a second partition; a print-head chamber in communication with the inlet chamber, the print-head chamber having a discharge nozzle for pulsatingly metering a quantity of ink onto a substrate, the second partition separating the print-head chamber from the inlet chamber; an outlet chamber in communication with the print-head chamber through a third partition, the outlet chamber receiving the substrate from print head chamber and exiting the substrate from a fourth chamber. In a preferred embodiment, the inlet chamber, the print-head chamber and the outlet chamber provide an inert gas environment while the discharge nozzle pulsatingly meters the quantity of ink onto the substrate. Although the implementation of the invention are not limited thereto, the inert gas environment can be a noble gas (e.g. argon, helium, nitrogen or hydrogen).

In still another embodiment, the disclosure relates to a load-locked thermal jet printing system. The system includes a housing with an inlet partition and an outlet partition. The housing defines a print-head chamber for depositing a quantity of ink onto a substrate. The housing also includes an inlet partition and an outlet partition for receiving and dispatching the substrate. A gas input provides a first gas to the housing. A controller communicates with the print-head chamber, the gas input and the inlet and outlet partitions. The controller comprises a processor circuit in communication with a memory circuit, the memory circuit instructing the processor circuit to (i) receive the substrate at the inlet partition; (ii) purge the housing with the first gas; (iii) direct the substrate to a discharge nozzle at the print-head chamber; (iv) energize the thermal jet discharge nozzle to pulsatingly deliver a quantity of film material from the discharge nozzle onto the substrate; and (v) dispatch the substrate from the housing through the outlet partition.

BRIEF DESCRIPTION OF THE DRAWINGS

These and other embodiments of the disclosure will be discussed with reference to the following exemplary and non-limiting illustrations, in which like elements are numbered similarly, and where.

DETAILED DESCRIPTION

Figure 1:
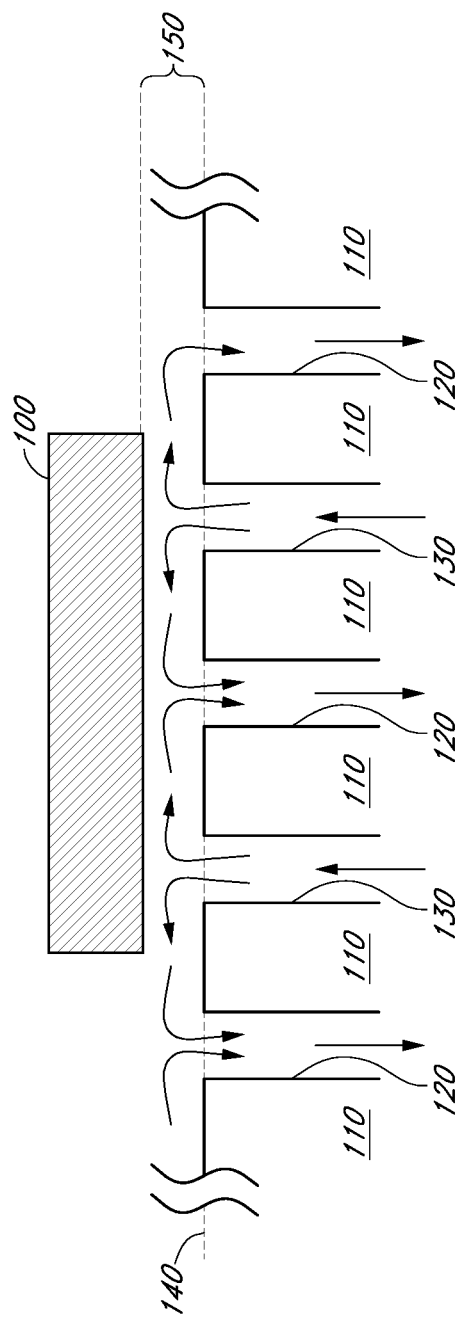
FIG. 1 is a schematic representation of a conventional substrate floatation system.

FIG. 1 is a schematic representation of a conventional substrate floatation system. More specifically, FIG. 1 shows a portion of a floatation system in which substrate 100 is supported by air bearings. The air bearings are shown schematically as arrows entering and leaving between baffles 110. The substrate floatation system of FIG. 1 is typically housed in a sealed chamber (not shown). The chamber includes multiple vacuum outlet ports 120 and gas bearing inlet ports 130, which are typically arranged on a flat surface 140. Substrate 100 is lifted and kept off a hard surface by the pressure of a gas such as nitrogen. The flow out of the bearing volume is accomplished by means of multiple vacuum outlet ports 120. The floating height 150 is typically a function of the gas pressure and flow. In principle, any gas can be utilized for such a substrate floatation system; however, in practice it is preferable to utilize a floatation gas that is inert to the materials that come into contact with the gas. As a result, it is conventional to use noble gases (e.g., nitrogen, argon, and helium) as they usually demonstrate sufficient inertness.

The floatation gas is an expensive component of the substrate floatation system. The cost is compounded when the printing system calls for substantially pure gas. Thus, it is desirable to minimize any gas loss to the environment.

Figure 2:
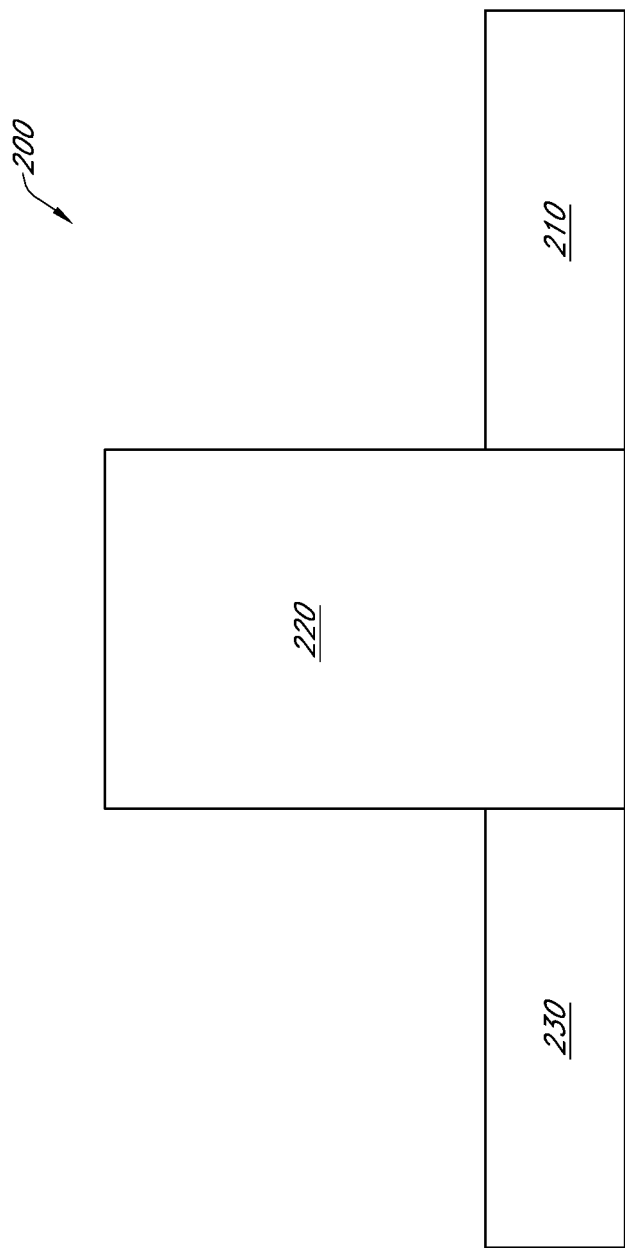
FIG. 2 is a schematic representation of an exemplary load-locked printing housing.

FIG. 2 is a simplified representation of an exemplary load-locked printing housing according to one embodiment of the disclosure. Housing 200 is divided into three chambers, including inlet chamber 210, print-head chamber 220 and outlet chamber 230. As will be discussed, each chamber is separated from the rest of housing 200 through a gate or a partition. In one embodiment of the disclosure the gates or partitions substantially seal the chambers from the ambient environment and from the rest of housing 200. In another embodiment of the disclosure (not shown), chamber 230 is not included in housing 200, and chamber 210 is utilized as both an inlet and an outlet chamber.

Figure 3:
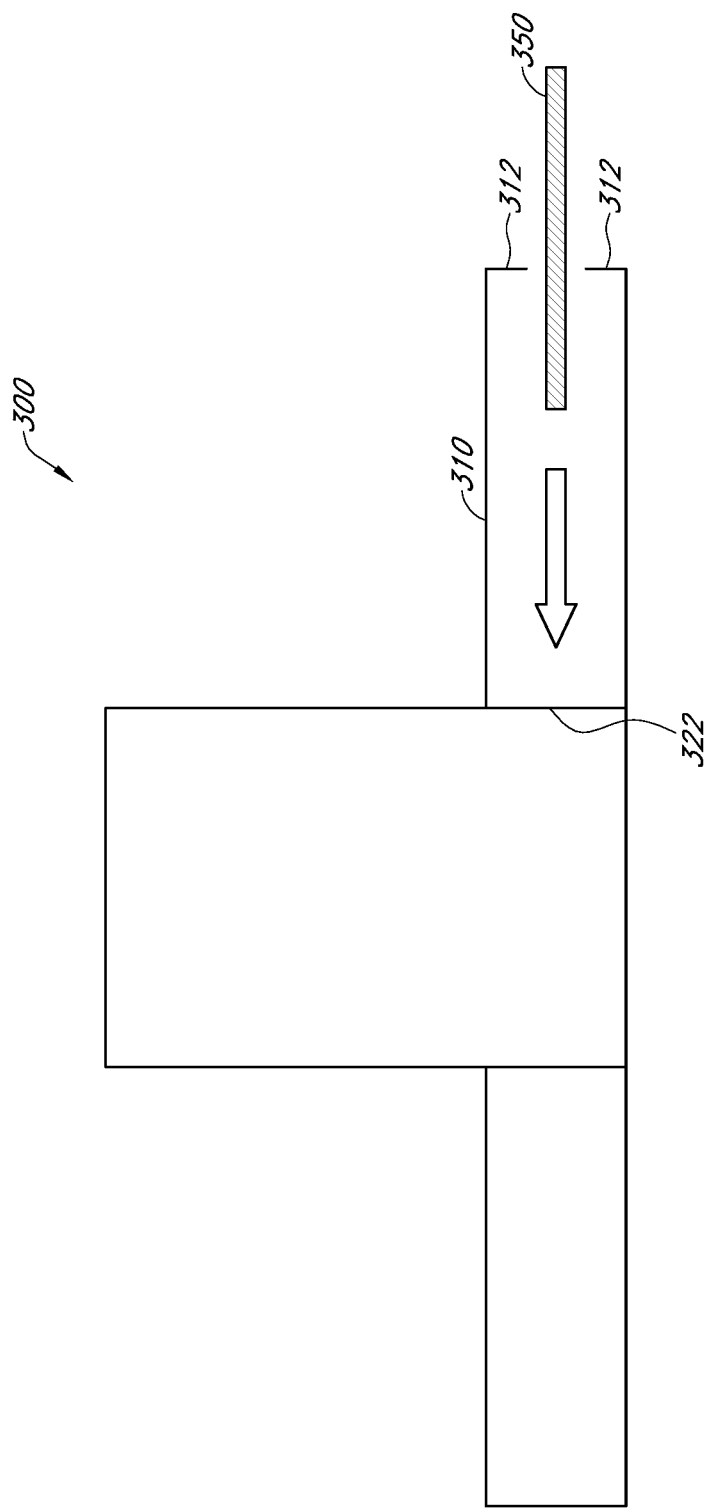
FIG. 3 is a schematic representation of the load-locked printing housing of FIG. 2 receiving a substrate.

FIG. 3 is a schematic representation of the load-locked printing housing of FIG. 2 receiving a substrate. During operation, substrate 350 is received at inlet chamber 310 through inlet gates 312. Inlet gates 312 can comprise a variety of options, including single or multiple moving gates. The gates can also be complemented with an air curtain (not shown) for minimizing influx of ambient gases into inlet chamber 310. Alternatively, the gates can be replaced with air curtains acting as a partition. Similar schemes can be deployed in all gates of the housing. Once substrate 350 is received at inlet chamber 310, inlet gates 312 close. The substrate can then be detained at inlet chamber 310. At this time, the inlet chamber can be optionally purged from any ambient gases and refilled with the desired chamber gas, which is conventionally selected to be the same as the floatation gas, e.g. pure nitrogen or other noble gases. During the purging process, print-head inlet gate 322 as well as inlet gate 312 remain closed. Print-head inlet gate 322 can define a physical or a gas curtain. Alternatively, print-head inlet gate 322 can define a physical gate similar to inlet gate 312.

Figure 4:
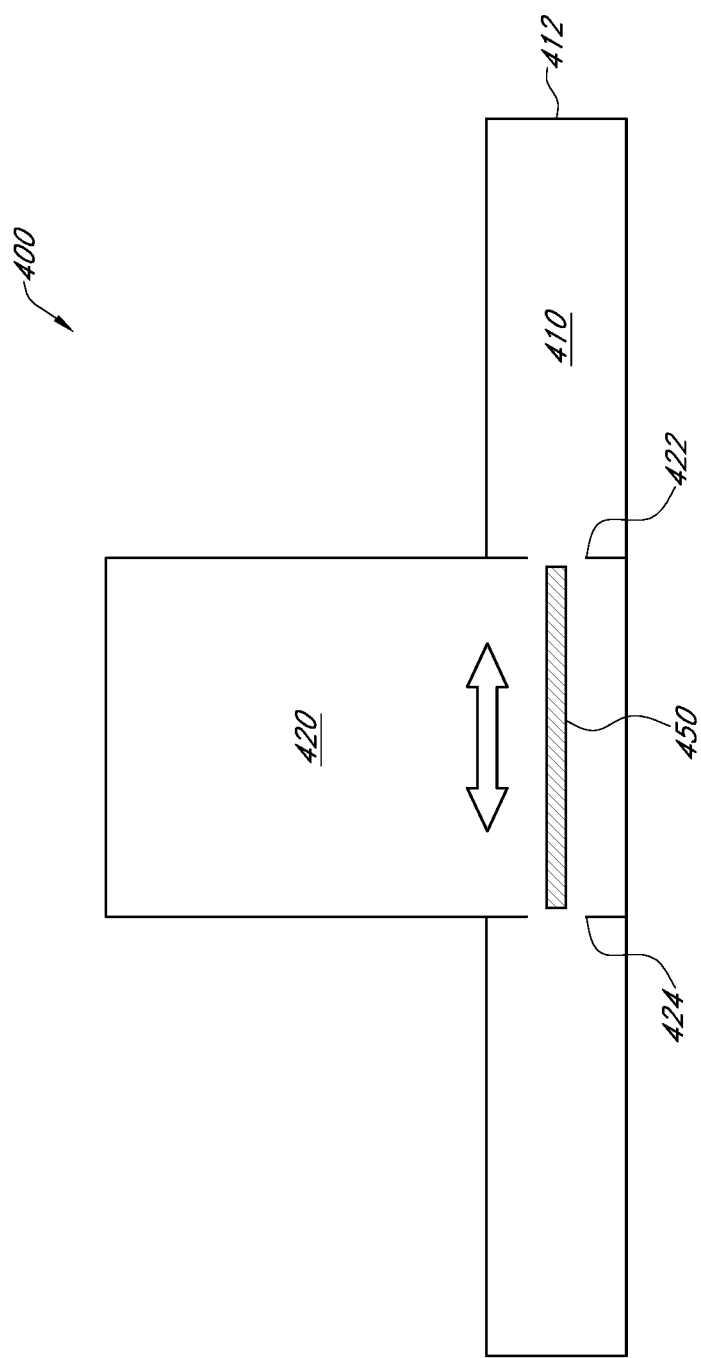
FIG. 4 schematically shows the substrate received at the print-head chamber of the housing.

FIG. 4 schematically shows the substrate received at the print-head chamber of the housing. Air bearings can be used to transport substrate 450 from inlet chamber 410 through print-head inlet gate 422 and into print-chamber 420. Print-head chamber 420 houses the thermal jet print-head, and optionally, the ink reservoir. The printing process occurs at print-head chamber 420. In one implementation of the invention, once substrate 450 is received at print-head chamber 420, print-head gates 422 and 424 are closed during the printing process. Print-head chamber can be optionally purged with a chamber gas (e.g., high purity nitrogen) for further purification of the printing environment. In another implementation, substrate 450 is printed while gates 422 and 424 remain open. During the printing operation, substrate 450 can be supported by air bearings. The substrate's location in relation to housing 400 can be controlled using a combination of air pressure and vacuum, such as those shown in FIG. 1. In an alternative embodiment, the substrate is transported through housing 400 using a conveyer belt.

Figure 5:
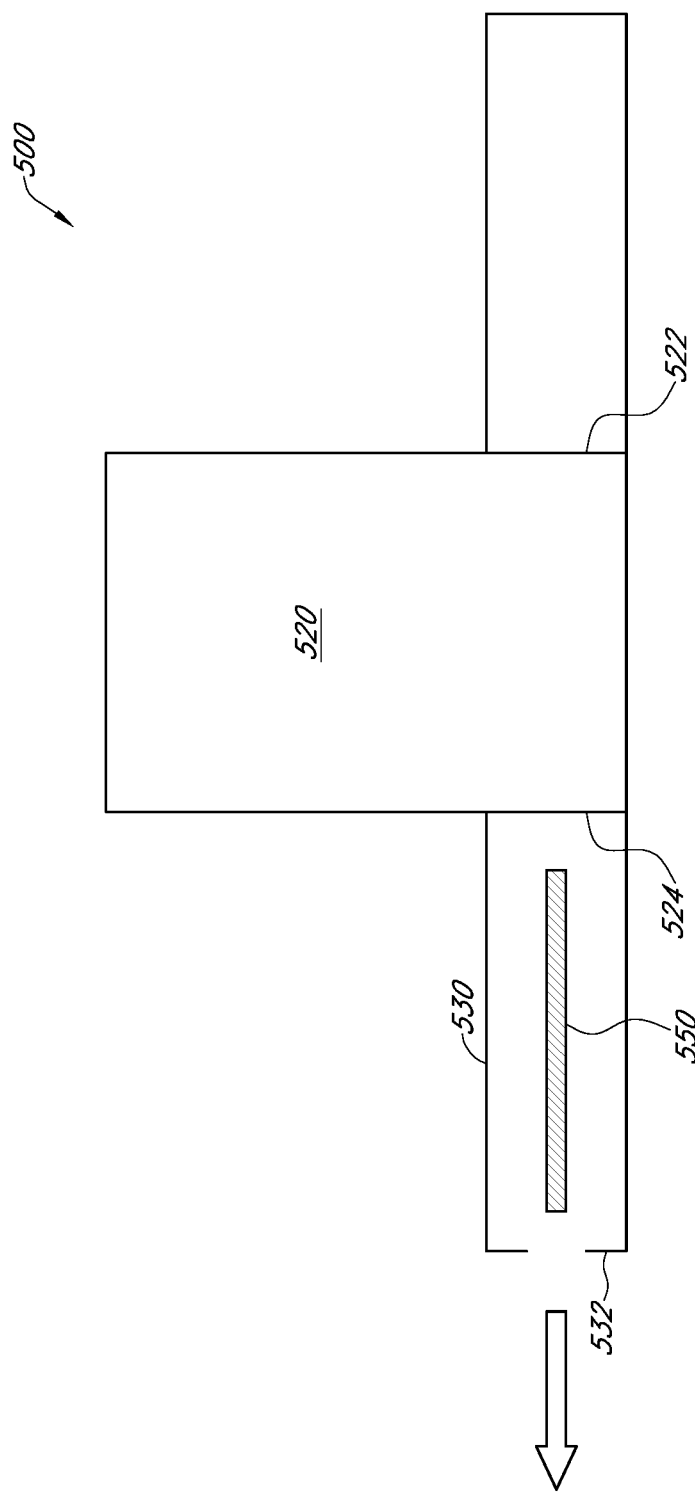
FIG. 5 schematically shows the completion of the printing process of FIGS. 3 and 4.

Once the printing process is complete, the substrate is transported to the outlet chamber as shown in FIG. 5. Here, print-head gates 522 and 524 are closed to seal off outlet chamber 530 from the remainder of housing 500. Outlet gate 532 is opened to eject substrate 550 as indicated by the arrow. The process shown in FIGS. 3-5 can be repeated to continuously print OLED materials on multiple substrates. Alternatively, gates 512, 522, 524 and 532 can be replaced with air curtains to provide for continuous and uninterrupted printing process. In another embodiment of the disclosure, once the printing process is complete, the substrate is transported back to the inlet chamber 310 through gate 322, where gate 322 can be subsequently sealed off and gate 312 opened to eject the substrate. In this embodiment, inlet chamber 310 functions also as the outlet chamber, functionally replacing outlet chamber 530.

The print-head chamber houses the print-head. In a preferred embodiment, the print-head comprises an ink chamber in fluid communication with nozzle. The ink chamber receives ink, comprising particles of the material to be deposited on the substrate dissolved or suspended in a carrier liquid, in substantially liquid form from a reservoir. The ink head chamber then meters a specified quantity of ink onto an upper face of a thermal jet discharge nozzle having a plurality of conduits such that upon delivery to the upper face, the ink flows into the conduits. The thermal jet discharge nozzle is activated such that the carrier liquid is removed leaving behind in the conduits the particles in substantially solid form. The thermal jet discharge nozzle is then further pulsatingly activated to deliver the quantity of material in substantially vapor form onto the substrate, where it condenses into substantially solid form.

Figure 6:
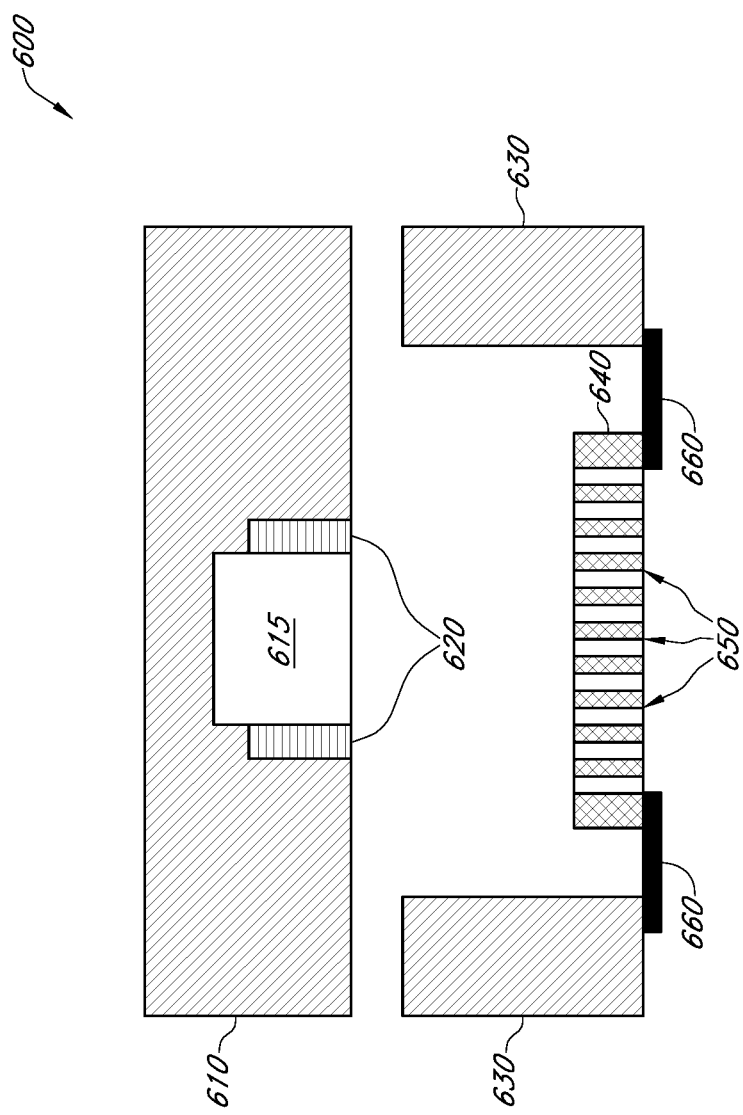
FIG. 6 is a schematic representation of a print-head for use with the load-locked housing of FIG. 2.

FIG. 6 is a schematic representation of a thermal jet print-head for use with the load-locked housing of FIG. 2. Print-head 600 includes ink chamber 615 which is surrounded by top structure 610 and energizing element 620. Ink chamber 615 is in liquid communication with an ink reservoir (not shown). Energizing element 620 can comprise a piezoelectric element or a heater. Energizing element 620 is energized intermittently to dispense a metered quantity of ink, optionally in the form of a liquid droplet, on the top surface of the thermal jet discharge nozzle 640.

Bottom structure 630 supports nozzle 640 through brackets 660. Brackets 660 can include and integrated heating element. The heating element is capable of instantaneously heating thermal jet discharge nozzle 640 such that the ink carrier liquid evaporates from the conduits 650. The heating element is further capable of instantaneously heating the thermal jet discharge nozzle 650 such that substantially solid particles in the discharge nozzle are delivered from the conduits in substantially vapor form onto the substrate, where they condense into substantially solid form.

Print-head 600 operates entirely within the print-head chamber 220 and housing 200 of FIG. 2. Thus, for properly selected chamber and floatation gases (e.g. high purity nitrogen in most instances), the ink is not subject to oxidation during the deposition process. In addition, the load-locked housing can be configured to receive a transport gas, such as a noble gas, for carrying the material from the thermal jet discharge nozzle 640 onto the substrate surface. The transport gas may also transport the material from the thermal jet discharge nozzle 640 to the substrate by flowing through conduits 650. In a preferred embodiment, multiple print-heads 600 are arranged within a load-locked print system as an array. The array can be configured to deposit material on a substrate by activating the print-heads simultaneously or sequentially.

Figure 7:
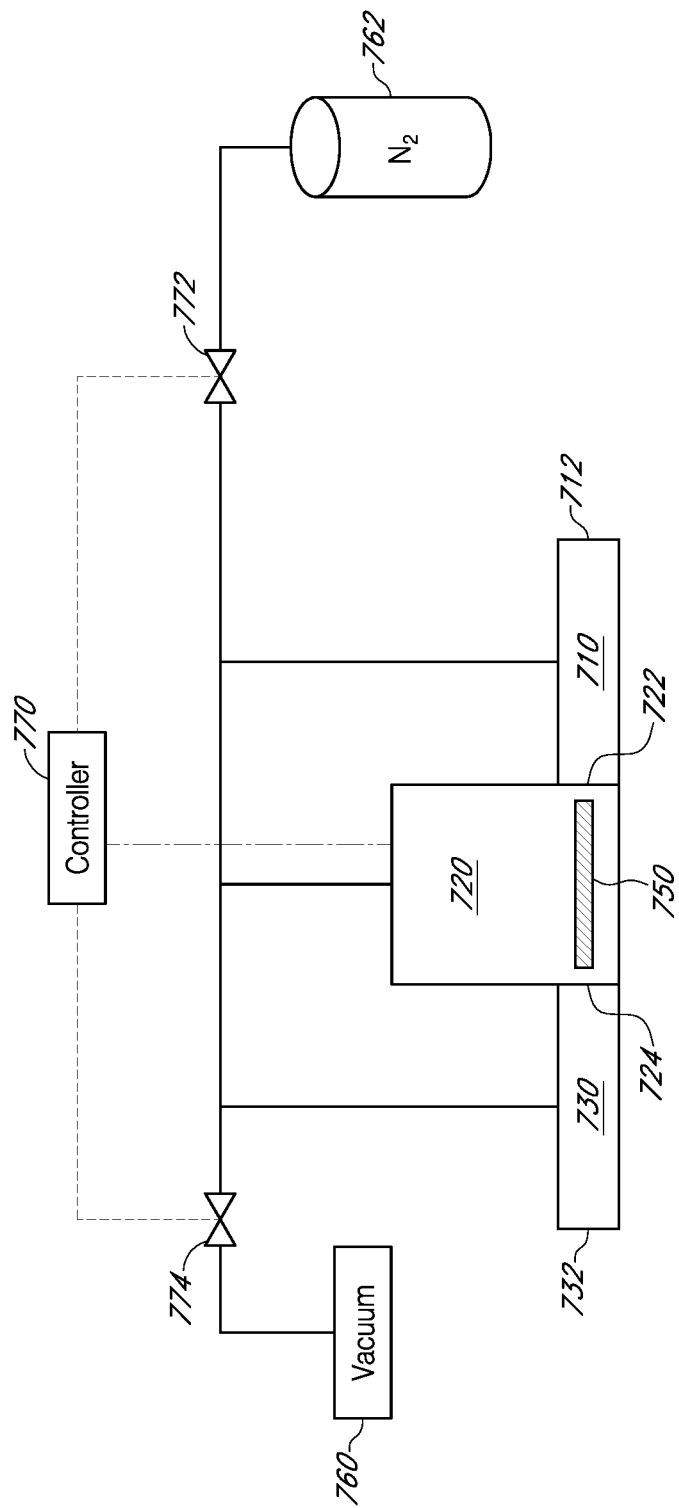
FIG. 7 is an exemplary load-locked system according to an embodiment of the invention.

FIG. 7 is an exemplary load-locked system according to an embodiment of the invention. Load-locked system of FIG. 7 includes a housing with inlet chamber 710, print-head chamber 720 and outlet chamber 730. Inlet chamber 710 communicates through gates 712 and 722. Print-head chamber 720 receives substrate 750 from the inlet chamber and deposits organic LED material thereon as described in relation to FIG. 6. Gate 724 communicates substrate 750 to outlet chamber 730 after the printing process is completed. The substrate exists outlet chamber 730 through gate 732.

Vacuum and pressure can be used to transport substrate 750 through the load-locked system of FIG. 7. To control transporting the substrate, controller 770 communicates with nitrogen source 762 and vacuum 760 through valves 772 and 774, respectively. Controller 770 comprises one or more processor circuits (not shown) in communication with one or more memory circuit (not shown). The controller also communicates with the load-locked housing and ultimately with the print nozzle. In this manner, controller 770 can coordinate opening and closing gates 712, 722, 724 and 732. Controller 770 can also control ink dispensing by activating the piezoelectric element and/or the heater (see FIG. 6). The substrate can be transported through the load-locked print system through air bearings or by a physical conveyer under the control of the controller.

In an exemplary operation, a memory circuit (not shown) of controller 770 provides instructions to a processor circuit (not shown) to: (i) receive the substrate at the inlet partition; (ii) purge the housing with the first gas; (iii) direct the substrate to a discharge nozzle at the print-head chamber; (iv) energize the discharge nozzle to pulsatingly deliver a quantity of material from the thermal jet discharge nozzle onto the substrate; and (v) dispatch the substrate from the housing through the outlet partition. The first gas and the second gas can be different or identical gases. The first and/or the second gas can be selected from the group comprising nitrogen, argon, and helium.

Controller 770 may also identify the location of the substrate through the load-locked print system and dispense ink from the print-head only when the substrate is at a precise location relative to the print-head.

Another aspect of the invention relates to registering the substrate relative to the print-head. Printing registration is defined as the alignment and the size of one printing process with respect to the previous printing processes performed on the same substrate. In order to achieve appropriate registration, the print-head and the substrate need to be aligned substantially identically in each printing step. In one implementation of the invention, the substrate is provided with horizontal motion (i.e., motion in the x direction) and the print-head is provided with another horizontal motion (i.e., motion in the y direction). The x and y directions may be orthogonal to each other. With this arrangement, the movement of the print-head with respect to the substrate can be defined with a combination of these two horizontal directions.

When the substrate is loaded onto a load-locked system, the areas to be printed are usually not perfectly aligned in the x and y directions of the system. Thus, there is a need for detecting the misalignment, determining the required corrections to the motion of the print-head relative to the substrate and applying the corrections.

According to one embodiment of the invention, the pattern or the previous printing is detected using a pattern recognition system. This pattern can be inherent in the previous printing or may have been added deliberately (i.e., fiducials) for the pattern recognition step. By means of its recognition of the pattern, the misalignment of the substrate to the printing system's motion, direction or axis can be determined. This manifests itself as a magnification misalignment, a translational misalignment and an angular misalignment.

Figure 8:
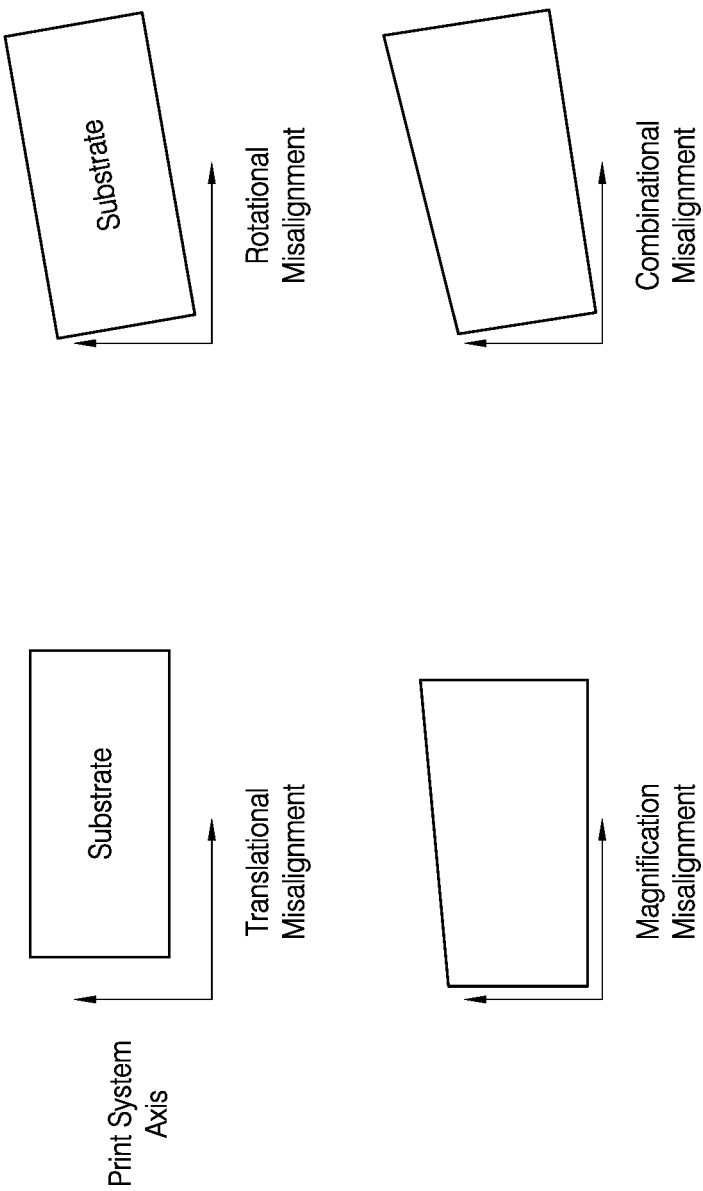
FIG. 8 shows several types of substrate misalignment within the print system.

FIG. 8 shows several types of substrate misalignment within the print system, including translational misalignment, rotational misalignment, magnification misalignment and combinational misalignment. For each print-head scan motion relative to the substrate, the pattern recognition system will look for and find/recognize the desired pattern. The pattern recognition system can optionally be integrated with the controller (see FIG. 7). The pattern recognition system will look for and find/recognize the desired pattern. The pattern recognition system will provide the degree of error/misalignment in the x and y directions to the system's controller, which will then reposition the print-head and substrate to eliminate the error/misalignment. This means that for several motions of the print-head with respect to the substrate, the motion control system will check for misalignment and make the necessary corrections.

Figure 9:
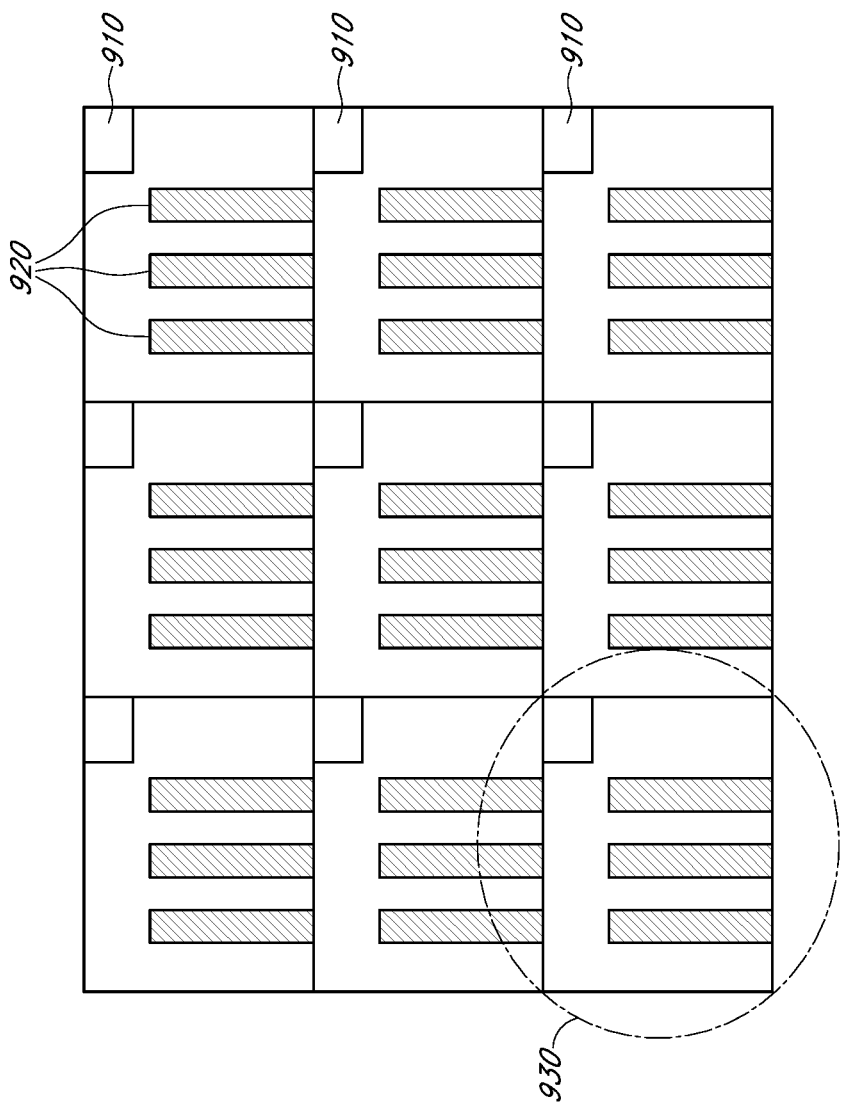
FIG. 9 shows a substrate pattern including fiducials and initial locus of area viewed by a camera or other imaging devices.

Alternatively, an initial scan of the entire substrate can be performed by the pattern recognition system utilizing the x and y motions available in the printing system. FIG. 9 shows a substrate pattern including fiducials and initial locus of area viewed by a camera or other imaging devices. In FIG. 9, fiducials or alignment targets are identified as boxes 910 in each replicated "pixel." Each pixel in this example, and in many OLED applications, comprises three sub-pixels each having a distinct color: red, green, and blue (RGB). The camera or the pattern recognition device initially focuses on an area of the substrate identified by circle 930. Once the amount of misalignment is determined, the motion control system can compensate for the misalignment by causing the x and the y directions to move in a rotated and translated set of axes $x_1$ and $y_1$ such that these axis are a linear combination of the previous motions.

For either alignment technique, the printing control system will then cause the print-head to fire appropriately at the desired print axis as it scans the substrate. In the case of the embodiment described above, the print system will periodically use the pattern recognition system to update and adjust for any misalignment, causing the print-head to fire after alignment has been achieved. Depending on the degree of misalignment, the required update and adjustment steps may have to be repeated more often during the printing operations. Alternatively, the pattern recognition system must scan the substrate initially to assess the amount and direction of misalignment, then printing control system will utilize the misalignment information to adjust the print-head firing accordingly.

While the principles of the disclosure have been illustrated in relation to the exemplary embodiments shown herein, the principles of the disclosure are not limited thereto and include any modification, variation or permutation thereof. For example, while the exemplary embodiments are discussed in relation to a thermal jet discharge nozzle, the disclosed principles can be implemented with different type of nozzles. Moreover, the same or different gases can be used for floating the substrate and for providing a non-oxidizing environment within the chamber. These gases need not be noble gases. Finally, the substrate may enter the system from any direction and the schematic of a tri-chamber system is entirely exemplary.

What is claimed is:

1. A method for forming a film on a substrate, the method comprising:
   transporting a substrate to a printhead region having an inert gas environment using gas floatation,
   floating the substrate on a gas in the printhead region using a combination of pressure and vacuum; and
   while floating the substrate in the printhead region:

moving the substrate in a first direction and moving at least one print-head in a second direction, the first and second directions being substantially orthogonal to each other, controlling a float height of the substrate using pressure of the gas, detecting a misalignment of the substrate, printing a material on a surface of the substrate using the at least one print-head; and using the detected misalignment to control printing the material on the surface of the substrate.

2. The method of claim 1, further comprising receiving the substrate at a inlet region, isolating the inlet region, and forming the inert gas environment prior to transporting the substrate to the printhead region.

3. The method of claim 1, further comprising, after transporting the substrate to the printhead region, isolating the printhead region.

4. The method of claim 1, further comprising transporting the substrate from the printhead region to an outlet region, wherein the printhead region and the outlet region are enclosed in a housing and separated by a partition.

5. The method of claim 1, further comprising controlling a location of the substrate using the pressure and vacuum.

6. The method of claim 1, wherein using the detected misalignment to control printing the material comprises adjusting position of at least one of the print-head and the substrate based on the misalignment and adjusting print-head firing based on the misalignment.

7. The method of claim 6, wherein detecting the misalignment comprises determining a magnification misalignment, a translational misalignment, an angular misalignment, or a combination thereof.

8. The method of claim 6, wherein detecting the misalignment comprises identifying an alignment target on the substrate using a camera.

9. The method of claim 1, further comprising aligning the substrate along the first direction before printing the material on the substrate.

10. A method for forming a film on a substrate, the method comprising:

transporting a substrate to a printhead region having an inert gas environment using gas floatation, floating the substrate on a gas in the printhead region using a combination of pressure and vacuum; and while floating the substrate in the printhead region:

moving the substrate in a first direction and moving at least one print-head in a second direction, the first and second directions being substantially orthogonal to each other, controlling a float height of the substrate using pressure of the gas, detecting a misalignment of the substrate, printing a material on a surface of the substrate using the at least one print-head; and using the detected misalignment to control dispensing the material from the at least one print-head while printing the material on the surface of the substrate.

11. The method of claim 10, wherein printing the material on the surface of the substrate comprises printing the material in a pattern on the surface of the substrate.

12. The method of claim 11, wherein the material is printed in a pattern on the surface of the substrate to form a display device.

13. The method of claim 10, wherein the material comprises an organic material.

14. The method of claim 10, wherein detecting the misalignment comprises determining a magnification misalignment, a translational misalignment, an angular misalignment, or a combination thereof.

15. The method of claim 14, wherein using the detected misalignment to control printing the material comprises adjusting position of at least one of the print-head and the substrate based on the misalignment to correct for the misalignment.

16. The method of claim 10, further comprising controlling a location of the substrate using the pressure and vacuum.

17. The method of claim 10, wherein:

the at least one print-head comprises an energizing element to dispense the material from the at least one print-head, and using the detected misalignment to control dispensing the material from the at least one print-head while printing the material on the surface of the substrate comprises activating the energizing element based on the misalignment.

18. A method for forming a film on a substrate, the method comprising:

transporting a substrate to a printhead region having an inert gas environment using gas floatation, floating the substrate on a gas in the printhead region using a combination of pressure and vacuum; and while floating the substrate in the printhead region:

moving the substrate in a first direction and moving at least one print-head in a second direction, the first and second directions being substantially orthogonal to each other, controlling a float height of the substrate using pressure of the gas, detecting a misalignment of the substrate, printing a material on a surface of the substrate by activating an energizing element of the at least one print-head to dispense the material onto the surface of the substrate;

positioning the substrate based on the detected misalignment; and activating the energizing element of the at least one print-head based on the detected misalignment.

19. The method of claim 18, further comprising controlling a location of the substrate using the pressure and vacuum.

20. The method of claim 18, wherein the material comprises an organic material.

* * * * *